(12) United States Patent
Laurent et al.

(10) Patent No.: US 8,539,141 B2
(45) Date of Patent: *Sep. 17, 2013

(54) OPTIMIZED FLASH MEMORY ACCESS METHOD AND DEVICE

(75) Inventors: Christophe Laurent, Agrate Brianza (IT); Andrea Martinelli, Nembro (IT); Stefan Schippers, Peschiera del Garda (IT); Graziano Mirichigni, Pietracamela (IT)

(73) Assignee: Micron Technnology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/197,056

(22) Filed: Aug. 3, 2011

(65) Prior Publication Data

US 2011/0289389 A1    Nov. 24, 2011

Related U.S. Application Data

(63) Continuation of application No. 11/787,101, filed on Apr. 13, 2007, now Pat. No. 8,015,345.

(30) Foreign Application Priority Data

Apr. 13, 2006   (IT) .............................. MI2006A0746

(51) Int. Cl.
    *G06F 12/00*    (2006.01)

(52) U.S. Cl.
    USPC ......................... 711/103; 711/111; 711/154

(58) Field of Classification Search
    USPC ..................... 711/103, 111, 154; 714/15
    See application file for complete search history.

(56) References Cited

U.S. PATENT DOCUMENTS

| 6,665,813 | B1 | 12/2003 | Forsman et al. |
| 7,430,693 | B2 | 9/2008 | Noguchi et al. |

*Primary Examiner* — Yong Choe
(74) *Attorney, Agent, or Firm* — Dorsey & Whitney LLP

(57) ABSTRACT

A method for accessing a non volatile memory device including at least one group or sector of memory cells divided into regions programmable with two different data storage densities and accessible with at least two reading modes, for example a two-level mode and a multilevel mode. The memory regions are being organized into pages including a sub-group of memory cells for storing error correction codes of the data stored in the multilevel mode. The method includes providing at the beginning of each page at least one first cell wherein the information concerning the ECC protection or not of the whole page is to be stored. In the sub-group of cells at least one second cell intended for the storage of information concerning the programmed or erased state of the same page is provided. The content of the first and of the second cell is read before accessing, in programming, the corresponding page of the memory region.

12 Claims, 6 Drawing Sheets

OPTIMIZED FLASH MEMORY ACCESS METHOD AND DEVICE

CROSS-REFERENCE TO RELATED APPLICATIONS

This application is a continuation of U.S. patent application Ser. No. 11/787,101, filed on Apr. 13, 2007 now U.S. Pat. No. 8,015,345.

PRIORITY CLAIM

This application claims priority from Italian patent application No. MI2006A000746, filed Apr. 13, 2006, which is incorporated herein by reference.

TECHNICAL FIELD

The present invention relates to non-volatile such as flash memory access methods and circuits and to corresponding memory devices.

BACKGROUND

As it is well known, the widespread use of multimedia applications and the expansion of these applications require a management of a greater and greater amount of data to be stored on a smaller and smaller space to favor a further miniaturization of memory devices provided with multimedia applications.

A first known solution to meet this need is that of storing at least two bits per memory cell thus realizing a non volatile memory device of the multilevel type which, instead of storing only one bit per cell, substantially allows doubling the device capacity for storing information with the circuit area occupied being the same.

The reading of multilevel devices occurs per page, i.e. plural memory words are read in parallel.

To maintain the standards of reliability within multilevel memories, the possibility is provided of an automatic correction of one or more bits by means of suitable parity bits added to the packet of words read in parallel. The definition of a correction code implies the impossibility of carrying out what is called bit manipulation i.e. the possibility of transforming, during successive programming, all the bits of value '1' into bits of value '0', such an operation traditionally being allowed by the specifications of the flash memories. In fact, each pattern modification implies the modification of the parity code necessary for the correction of the errors and the new calculated value can be incompatible with this impossibility to erase the cells.

Another drawback which equally prevents successive programming of the cell with two bits per cell is the so called floating gate coupling which causes a widening of the distributions of the read thresholds incompatible with the margins provided for the good operation of a multilevel device. This is due to the fact that capacitive couplings are formed between memory cells being topologically near, and this modifies the reading thresholds.

A possible solution to this problem provides the definition of memory regions within the array being programmable only once so as to avoid these intolerable couplings caused by the repeated programming.

However, to have a repeatedly programmable memory, inside the same multilevel device, a programmable region with a bit per cell for storing small amounts of data can be defined. In this way, the memory region is used with half efficiency but allows a more frequent refresh.

This solution, however, is not exempt from drawbacks. In particular, the programming step of a two-level region risks being very burdensome for the application since a preliminary reading of the region of interest for programming must be requested for establishing if the programming is being carried out on virgin cells or not, so as to avoid an undesirable "bit manipulation". Otherwise, the microprocessor is obliged to manage and dynamically update a map of the state of use of the array.

SUMMARY

Embodiments of the present invention exploits a coding of the information contained in the memory cells intended for hosting the parity bits of the ECC by exploiting this information also for the processing of data programmed with a bit per cell, thus optimizing the communication between the memory and the microprocessor.

An electronic memory device monolithically integrated on a semiconductor and method of reading such a device includes a group or sector of memory cells divided into programmable regions with at least two different data storage densities and accessible with at least two reading modes, for example two-level and multilevel. The regions are organized into pages including at least one sub-group of memory cells for storing error correction codes of the data stored in the multilevel mode.

The following embodiments of the invention are directed to flash NOR memory architectures and the following description is made with reference to this field of application for convenience of illustration only, with other embodiments being directed to other types of memory architectures.

The characteristics and advantages of the device according to the invention will be apparent from the following description of an embodiment thereof given by way of indicative and non limiting example with reference to the annexed drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 4:
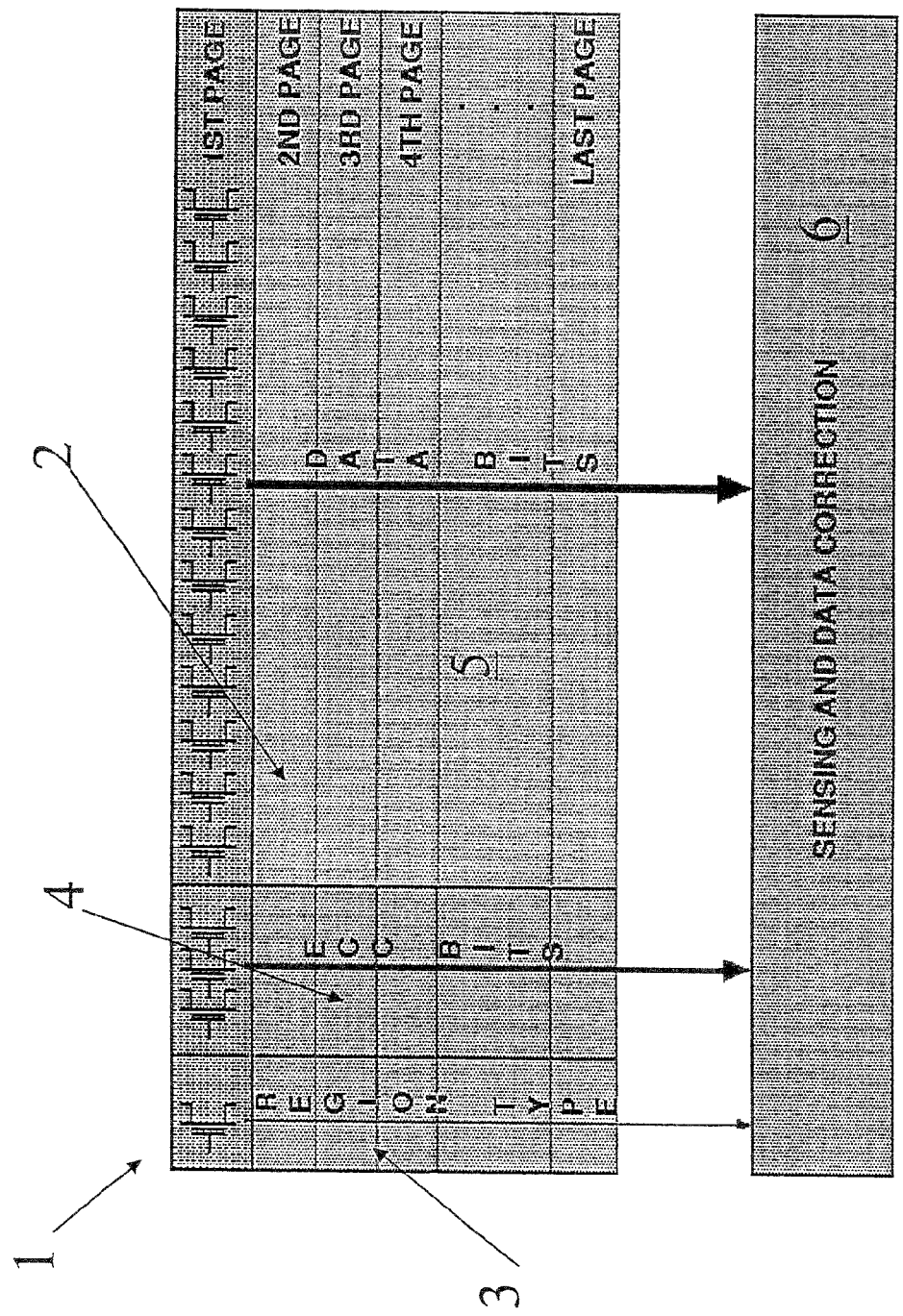
FIG. 4 shows a schematic view of a layout of a memory device realized according to the prior art.
Figure 5:
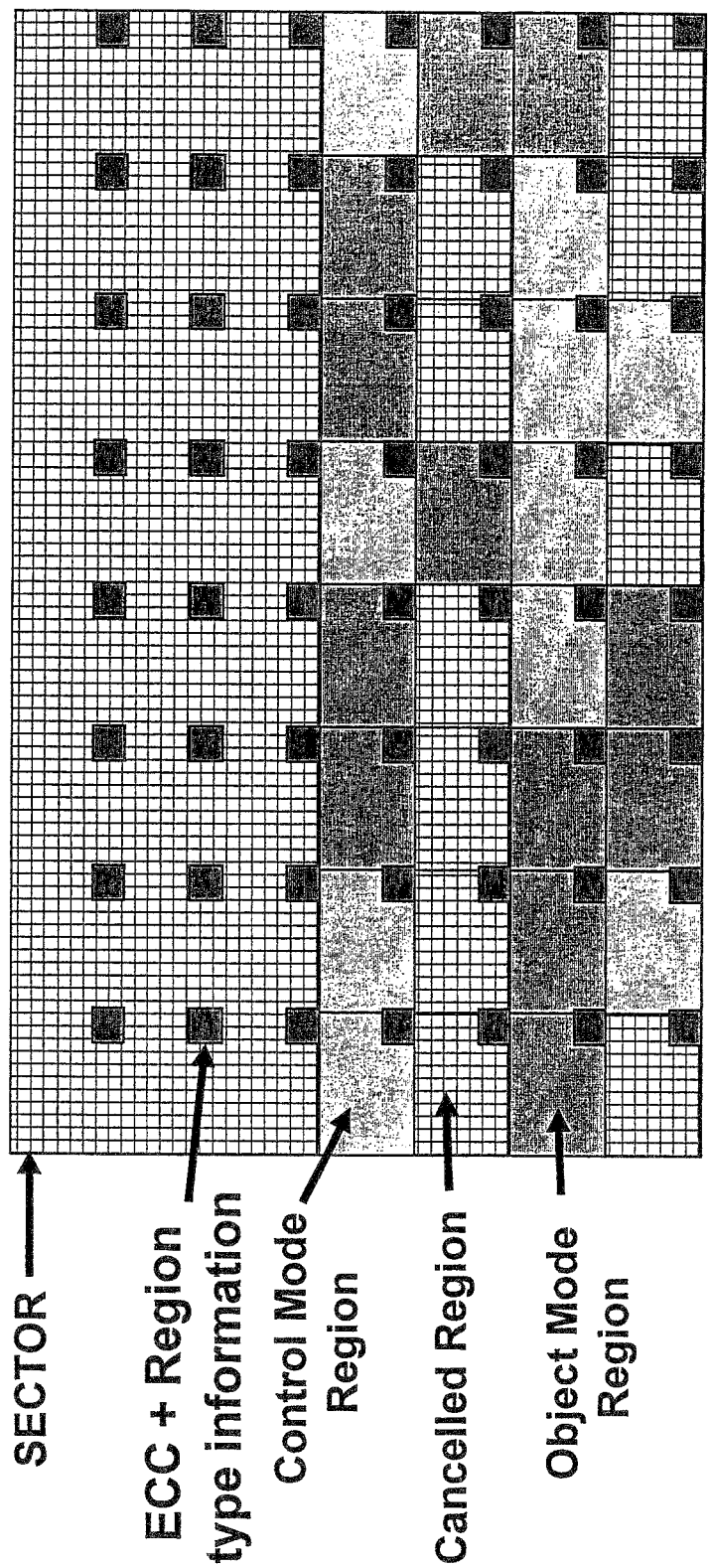
FIG. 5 shows a schematic view of a sector containing different memory regions in the different possible states (Erased, Control Mode, Object Mode) and their additional bits (ECC bit and control bits of the state of the region).

With reference to these figures, FIG. 4 schematically shows the physical structure of an electronic memory device 1 realized according to the prior art and wherein a memory region 2 can be programmed both in the two-level mode, with one bit per cell 1BC, and in the multilevel mode, with two bits per cell 2BC.

Each page (1st page, 2nd page, ..., last page) of the region 2 contains a cell for storing the type of region. The cells of each page containing the bits indicative of the region are arranged in the region 3 called REGION_TYPE, while some cells 4 indicated as ECC_BITS are used for storing the error correction codes.

The remaining cells 5 of the region 2 are intended for storing the bits of the data, DATA_BITS.

This structure can be used in two different ways according to the chosen region type. The defined regions can be of two types:
  Regions 2BC whose cells are programmed in the multilevel mode only once and wherein the ECC (Error Correction Code) is applied in the re-reading step. On these regions it is thus not possible to carry out the "bit manipulation", i.e. the stepped programming of the cells with writing of the logic values of the 'programmed' type on logic values of the 'erased' type. These regions are intended for storing huge volumes of data which seldom change.
  Regions 1BC whose cells are programmed in the two-level mode with a bit per cell and thus with more relaxed margins which allow subjecting them to a bit manipulation. As already said, this bit manipulation prevents protecting the data with an ECC code since also a small modification of the data causes a radical change of the values of the ECC bits. This will surely require the transition from a programmed value to an erased value and this operation is not possible within a programming step. These regions are intended for storing small amounts of data which frequently change since the memory is used with half efficiency.

Only for giving a quantitative information of the purely indicative and non limiting type, the device 1 can be formed by sectors of 1 M Cells equal to 256 regions of the 2 type.

Each region comprises 4 k Cells equal to 32 pages.

Each page comprises 128 Cells equal to 8 words in Control Mode (1 bit/cell) and equal to 16 words in Object Mode (2 bits/cell).

For storing great amounts of data most of the memory area is programmed in the multilevel mode with two bits per cell.

With this solution also the signalling of a suitable error is provided in case a two-level region is tied to be programmed with multilevel mode or vice versa. The programming step, in one case or in the other, is carried out in the usual way.

The bit REGION_TYPE 3 is used in the data reading and correction step which occurs by means of the block 6 called SENSING_AND_DATA_CORRECTION in FIG. 4.

Figure 2:
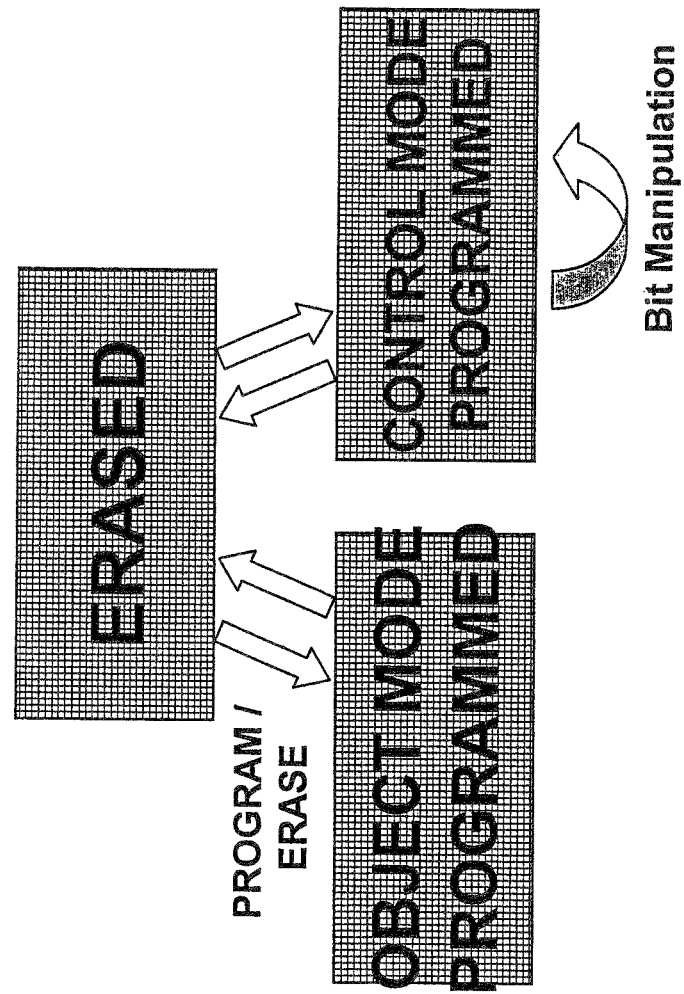
FIG. 2 shows a schematic view illustrating the different possible states and the operations authorized on a given memory region according to known specifications; in particular, for the last generations of memories which authorize different types of programming, both two-level and multilevel.
Figure 1:
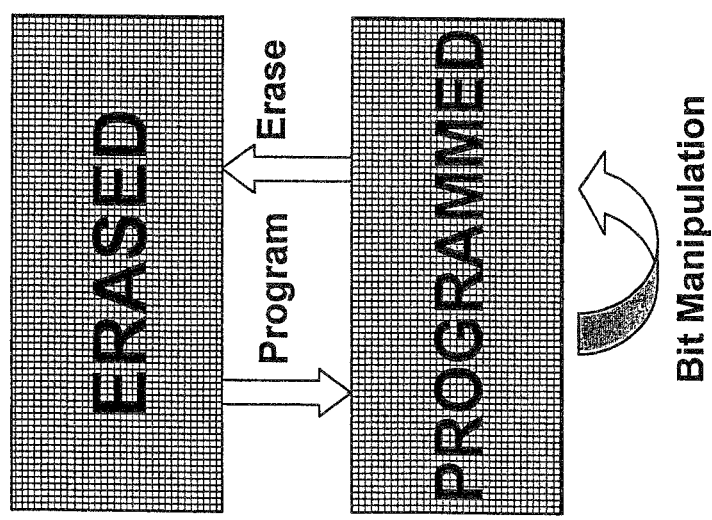
FIG. 1 shows a schematic view illustrating the normal relation modes between a portion of erased memory and the same portion of programmed memory, with the possibility of "bit manipulation" according to the prior art; in this case the technique can be applied to memories which use a single type of programming, either of the two-level type or of the multilevel type.
Figure 3:
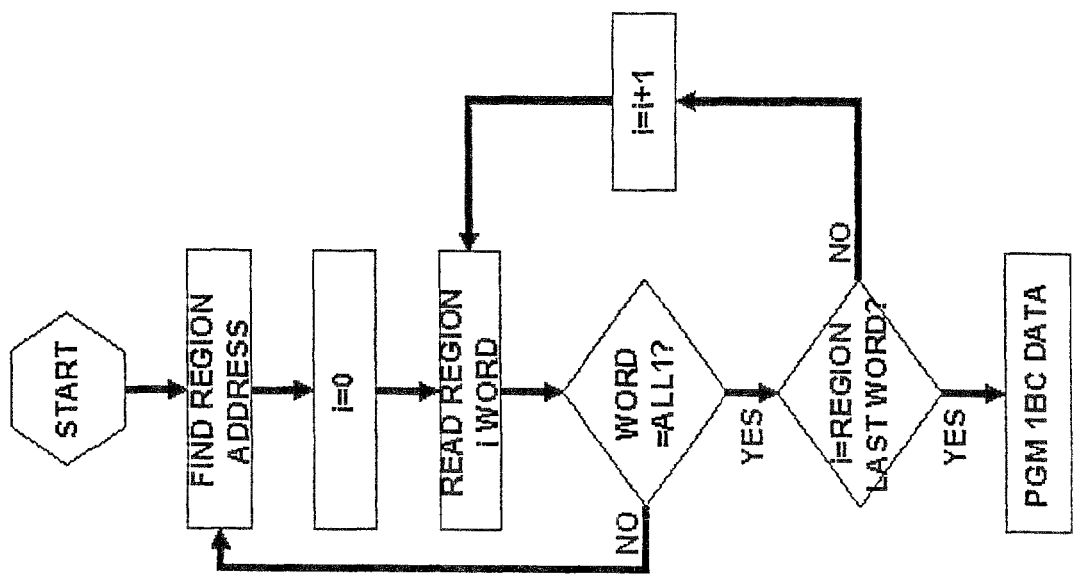
FIG. 3 shows a simplified flowchart of the operations which should be carried out by an application to check if a memory region is erased before proceeding with the writing of a data buffer in the two-level mode.

For example, for the programming with a bit per cell an algorithm is used which evolves as shown in the flowchart of FIG. 3. If the application must carry out the first programming of a pattern with 1 bit per cell it is first necessary to check if the flash region intended for receiving the data is able to house them, i.e. in other words, if it is erased. The procedure starts with the search for the address of the region to be programmed FIND_ADDRESS_REGION.

An iteration follows of a reading of the word or n-th word of the region 2 by means of a command READ_REGION_i_WORD for all the words of the region.

As long as the read word is equal to erased the iteration is to be carried out, since it could be an erased region which is characterised in that it has all the words of the region of value ALL1. It is necessary to read all the content of a region before knowing if it is not a programmed or erased region.

If instead an area has already been programmed in the multilevel mode, its ECC guard bit has been programmed and if this ECC guard bit were available for the user, it would be thus simple and quick to verify that the whole region is defined as multilevel and thus no more modifiable.

The solution proposed by embodiments of the present invention for optimizing the communication between the memory and the microprocessor in charge of the management of the same exploits a more elaborated coding of the information contained in the cells intended for hosting the parity bits of the error correction ECC.

Figure 7:
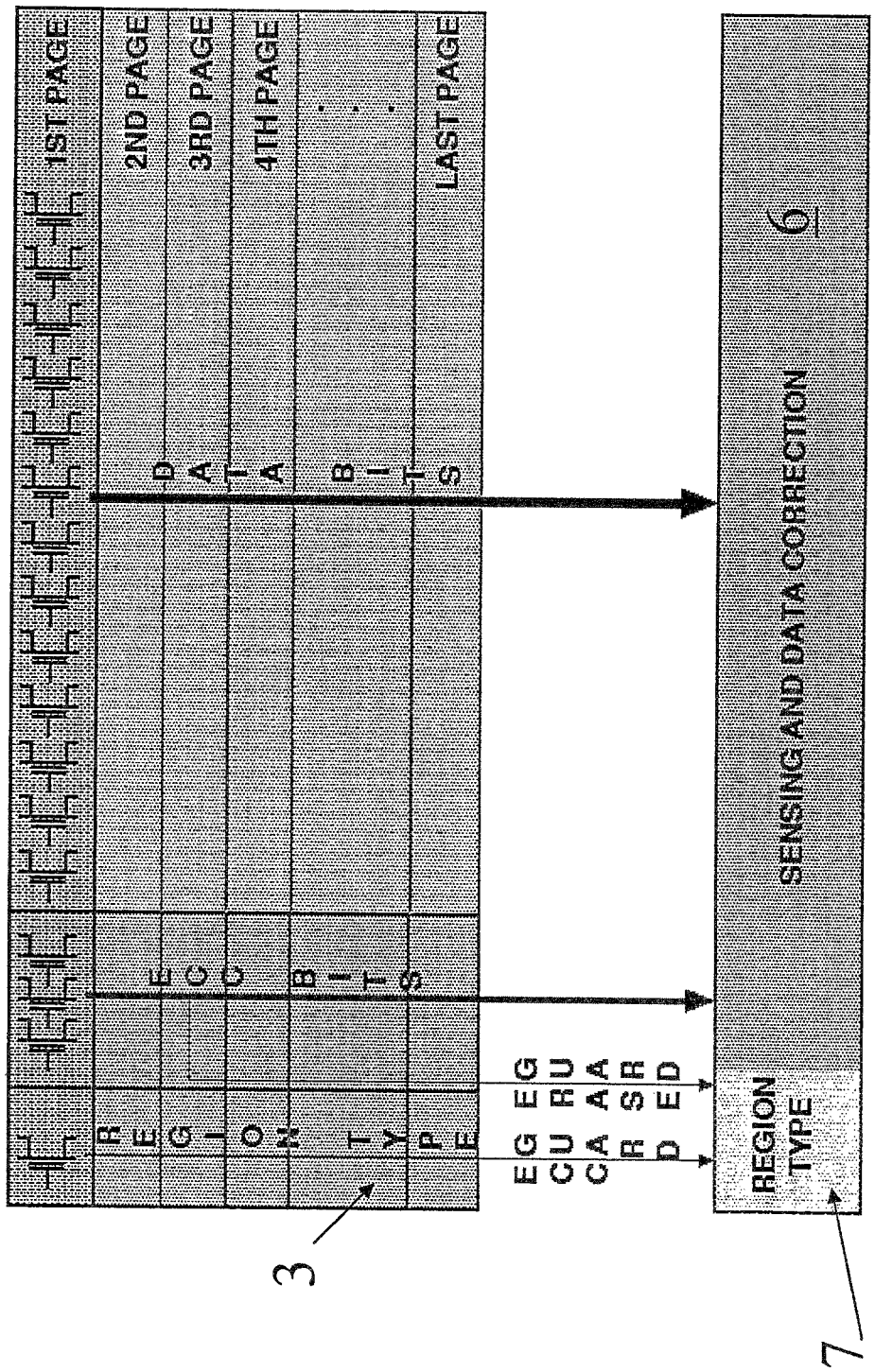
FIG. 7 shows the physical structure of a memory region according to an embodiment of the present invention.

The presence of two types of region, of which a single one is subjected to error correction ECC, has led to define a cell 7 (see FIG. 7) indicated with ECC GUARD which determines if the error correction ECC should be applied or not to the bits of the read page.

In other words, the content of the ECC GUARD cell 7, for example if programmed, indicates the need of an error correction. Vice versa if the cell 7 is erased.

It is to be noted that this piece of information is with one bit per cell since it cannot be corrected with ECC.

In case of a region with one bit per cell all the ECC bits become unusable and one cell can be chosen among them, which will be called ERASE GUARD, and which will serve for coding the information if the page is with one bit per cell.

The following table shows the coding that follows.

| ECC GUARD | ERASE GUARD | Comments |
|---|---|---|
| 0 | X | 2BC Region, Erase Guard cell used for ECC correction |
| 1 | 0 | 1BC Region |
| 1 | 1 | Erased Region |

The user can easily obtain the information concerning the state of a given region by using the command "Read Region State". Then, by reading the first page of each region, the state of the respective region is transferred to the output.

If a region is composed of different pages it can be assumed that for determining the type of region one can refer to one of the pages composing it, for example to the first.

In this case, the programming algorithm of the regions with one bit per cell, which, thanks to their nature, allow modifying also a single cell and thus a single page, will have to take care, when working on an erased region, of marking, in any case, the cell of the first page identifying the region.

Figure 6:
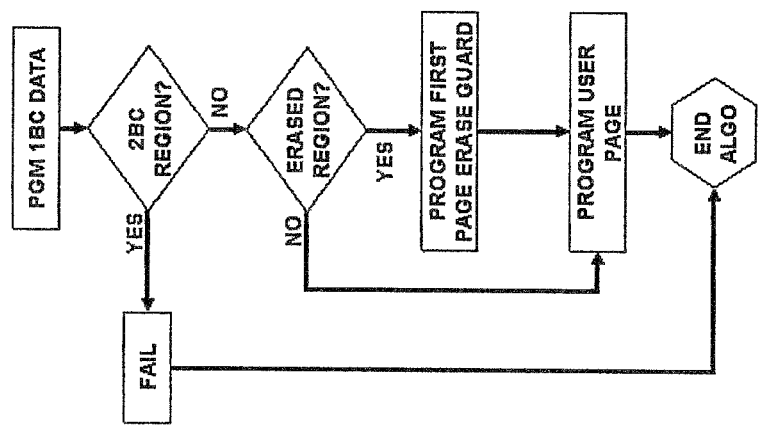
FIG. 6 shows a simplified flowchart of the operations provided for accessing the memory device according to an embodiment of the invention.

This is true even if this page is not directly involved in the current programming. The corresponding simplified flowchart is shown in FIG. 6.

The introduction of the ERASE GUARD cell allows for the definition of three possible states of the region, which can be identified with 'erased region', 'programmed region 2 bit per cell' and 'programmed region 1 bit per cell'.

Another advantage of the introduction of the 'ERASE GUARD' cell is given by the fact that also the region which is in the erase state can benefit from the error correction ECC, this because the matrix generating the code ECC has been chosen so as to obtain that the configuration of ECC cells which serves for correcting an erased page of data is exactly the completely erased configuration.

In other words, after an erase operation of a sector all the pages contained therein benefit from the error correction ECC (if a faulty cell in a page loses the erased state it is corrected).

The programming of the page requested by the user will comprise, in case it has not occurred yet, also the ERASE GUARD cell of the page itself.

Having introduced, with these measures, a single reference cell for the whole region it is possible to define a new reading mode of the memory: READ REGION; which allows for reading the state of a whole region.

This mode will operate similarly to the already existing modes, i.e.:

READ_ARRAY, which supplies the content of the matrix;
READ_CFI, which supplies the content of the Common Flash Interface;
READ_SR, which supplies the state of the device.

In the mode provided by embodiments the present invention the memory device will output the content of the two cells of the first page of each region.

In conclusion, devices according to embodiments of the invention allow improving the memory access information since, thanks to the introduction of the 'ERASE GUARD' cell, the region which is in the erased state can benefit from the error correction ECC. Then, after an erase operation of a given sector all the pages contained therein benefit from the error correction ECC and even if a faulty cell in a page loses the erased state, it can be corrected.

Memory devices according to embodiments of the present invention may be utilized in a variety of different types of electronic systems, such as computer systems, portable devices like cellular telephones, personal digital assistants and FLASH memory sticks, and so on.

From the foregoing it will be appreciated that, although specific embodiments of the invention have been described herein for purposes of illustration, various modifications may be made without deviating from the spirit and scope of the invention.

What is claimed is:

1. A method comprising:
   providing, for a memory page, at least one first cell storing first data indicating whether error correction code for the memory page is to be stored in a plurality of cells;
   providing, in said plurality of cells, at least one second cell to store information concerning a programmed or erased state of the memory page; and
   utilizing the first data stored by the at least one first cell and the information stored by the at least one second cell when accessing data stored by the memory page.

2. The method according to claim 1, wherein said first cell is part of the first page of a region and said second cell is a cell being part of said plurality of cells for the error correction in a multilevel mode.

3. The method according to claim 2, enabling programming a page by providing for programming of said first or second cell.

4. A method comprising:
   for a page of memory, storing in at least one memory cell in the page, first data indicating whether error correction code information for the page is to be stored; and
   for said page of memory, storing in at least one memory cell in the page, second data indicating a programmed or erased state of the page,
   wherein prior to accessing data stored in each page of memory, reading the first data and second data for the page.

5. The method of claim 4 including storing two or more bits of data in multilevel storage cells in a page and storing a single bit of data in some of the memory cells.

6. The method of claim 4 including the second data and first data defining three possible states for a region of the memory corresponding to a plurality of pages of memory, the three states being an erased state, a two bits per cell state, and a one bit per cell state, and utilizing the first data in the erased state and the two bits per cell state.

7. The method of claim 4 wherein each of the memory cells comprises a FLASH memory cell.

8. The method of claim 4 wherein accessing data stored in each page of memory comprises programming data in such memory cells in the page and erasing the data stored in such memory cells in the page.

9. A memory device comprising:
   a page including a subgroup of memory cells to store error correction code data associated with data stored in the other memory cells in that page;
   wherein the page includes at least one memory cell operable to store first data indicating whether error correction coding is applied to data stored in the memory cells of that page; and
   wherein the subgroup of memory cells in each page stores second data indicating a programmed or erased state of the data stored in the memory cells of that page; and
   sensing and data correction circuitry coupled to a memory cell array including the page, wherein the sensing and data correction circuitry is operable to utilize the first data and the second data when accessing data stored in the pages.

10. The memory device of claim 9 wherein each of the memory cells in the memory cell array comprises a FLASH memory cell.

11. The memory device of claim 9 wherein the memory cells in some of the pages are multilevel storage cells storing two or more bits of data and some of the memory cells store a single bit of data.

12. The memory device of claim 9 wherein the second data and first data define three possible states for each region of the memory, the three states being an erased state, a two bits per cell state, and a one bit per cell state, and wherein the first code data is utilized in the erased state and the two bits per cell state.

* * * * *

UNITED STATES PATENT AND TRADEMARK OFFICE
CERTIFICATE OF CORRECTION

PATENT NO. : 8,539,141 B2  
APPLICATION NO. : 13/197056  
DATED : September 17, 2013  
INVENTOR(S) : Christophe Laurent et al.

Page 1 of 1

It is certified that error appears in the above-identified patent and that said Letters Patent is hereby corrected as shown below:

On Title Page, Item (73), under "Assignee", column 1, line 1, delete "Technnology," and insert -- Technology, --, therefor.

In the Claims

In column 6, line 23, in Claim 6, delete "stales" and insert -- states --, therefor.

Signed and Sealed this  
Twenty-sixth Day of November, 2013

Margaret A. Focarino  
*Commissioner for Patents of the United States Patent and Trademark Office*